United States Patent
Fudeta et al.

(10) Patent No.: US 7,645,622 B2
(45) Date of Patent: Jan. 12, 2010

(54) METHOD OF PRODUCING NITRIDE-BASED SEMICONDUCTOR DEVICE, AND LIGHT-EMITTING DEVICE PRODUCED THEREBY

(75) Inventors: Mayuko Fudeta, Mihara (JP); Hiroshi Nakatsu, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 460 days.

(21) Appl. No.: 11/408,689

(22) Filed: Apr. 20, 2006

(65) Prior Publication Data
US 2006/0240584 A1    Oct. 26, 2006

(30) Foreign Application Priority Data
Apr. 21, 2005 (JP) .............................. 2005-123910
Sep. 8, 2005 (JP) .............................. 2005-261061

(51) Int. Cl.
*H01L 21/00* (2006.01)
(52) U.S. Cl. .............................. 438/20; 438/22; 438/46; 257/E21.001
(58) Field of Classification Search .................... 438/20, 438/22, 46
See application file for complete search history.

(56) References Cited

U.S. PATENT DOCUMENTS

| | | | |
|---|---|---|---|
| 5,281,830 A | 1/1994 | Kotaki et al. | |
| 5,990,495 A | 11/1999 | Ohba | |
| 6,475,882 B1 | 11/2002 | Sakai et al. | |
| 6,593,016 B1 * | 7/2003 | Chiyo et al. | ................. 428/698 |
| 6,802,902 B2 | 10/2004 | Beaumont et al. | |
| 2001/0019849 A1 | 9/2001 | Manabe et al. | |
| 2003/0211645 A1 | 11/2003 | Lee et al. | |
| 2004/0094772 A1 | 5/2004 | Hon et al. | |
| 2006/0175628 A1 | 8/2006 | Otsuka et al. | |

FOREIGN PATENT DOCUMENTS

| | | |
|---|---|---|
| CN | 1290958 A | 4/2001 |
| DE | 103 21 305 A1 | 12/2004 |
| JP | 06-196757 A | 7/1994 |
| JP | 2005-5658 | 1/2005 |
| TW | 200512959 | 4/2005 |

OTHER PUBLICATIONS

Chinese Office Action dated Feb. 15, 2008, directed to counterpart Chinese Application No. 200610074666.7; 17 pages.

* cited by examiner

*Primary Examiner*—Jack Chen
(74) *Attorney, Agent, or Firm*—Morrison & Foerster LLP

(57) ABSTRACT

A method of producing a nitride-based semiconductor device includes the steps of growing an $In_xAl_yGa_{1-x-y}N$ ($0 \leq x$, $0 \leq y$, $x+y<1$) buffer layer (2; 12; 22; 32; 42) on a substrate (1; 11; 21; 31; 41) at a first substrate temperature, and growing a first conductivity type nitride-based semiconductor layer (4; 14; 24; 34; 44) on the buffer layer at a second substrate temperature. The first temperature is higher than the second temperature.

4 Claims, 7 Drawing Sheets

METHOD OF PRODUCING NITRIDE-BASED SEMICONDUCTOR DEVICE, AND LIGHT-EMITTING DEVICE PRODUCED THEREBY

This nonprovisional application is based on Japanese Patent Applications Nos. 2005-123910 and 2005-261061 filed with the Japan Patent Office on Apr. 21, 2005 and Sep. 8, 2005, respectively, the entire contents of which are hereby incorporated by reference.

BACKGROUND OF THE INVENTION

1. Field of the Invention

The present invention relates to improvement in a semiconductor device including a layer of nitride-based compound semiconductor ($In_xAl_yGa_{1-x-y}N$: $0 \leq x$, $0 \leq y$, $x+y<1$), and improvement in a producing method thereof.

2. Description of the Background Art

Japanese Patent Laying-Open No. 06-196757 discloses a method of producing a nitride-based semiconductor device, which can be used for producing a blue light-emitting diode, a blue laser diode or the like. According to the disclosure of Japanese Patent Laying-Open No. 06-196757, a GaN buffer layer is grown to about 20 nm thickness on a sapphire substrate at a substrate temperature of 510° C. On the GaN buffer layer, a GaN layer is grown to about 2 μm thickness at a substrate temperature of 1030° C. Further, on the GaN layer, an InGaN light-emitting layer is grown at a substrate temperature of 800° C.

When the GaN buffer layer is grown at the low temperature of 510° C. as disclosed in Japanese Patent Laying-Open No. 06-196757, the grown GaN buffer layer is in an amorphous state. When the GaN layer is grown at the high temperature of 1030° C. on the amorphous GaN buffer layer, dislocations are generated from the interface with the amorphous GaN buffer layer and then extend penetrating or threading through the GaN layer being grown at the high temperature. When the InGaN light-emitting layer is grown at the high temperature of 800° C. on the GaN layer including such threading dislocations, the threading dislocations propagate into the light-emitting layer. As a result, in a nitride-based semiconductor light-emitting device produced with the light-emitting layer including such threading dislocations, its light-emitting efficiency becomes low due to the threading dislocations.

SUMMARY OF THE INVENTION

In view of the foregoing, a primary object of the present invention is to provide a nitride-based semiconductor device including less threading dislocations, and then to provide a nitride-based semiconductor light-emitting device improved in optical output power.

According to an aspect of the present invention, a method of producing a nitride-based semiconductor device includes the steps of growing an $In_xAl_yGa_{1-x-y}N$ ($0 \leq x$, $0 \leq y$, $x+y<1$) buffer layer on a substrate at a first substrate temperature, and growing a first conductivity type nitride-based semiconductor layer on the buffer layer at a second substrate temperature, wherein the first temperature is higher than the second temperature.

According to another aspect of the present invention, a method of producing a nitride-based semiconductor device includes the steps of growing an $In_xAl_yGa_{1-x-y}N$ ($0 \leq x$, $0 \leq y$, $x+y<1$) buffer layer on a substrate at a first substrate temperature, growing a SiN layer on the buffer layer at a second substrate temperature, and growing a first conductivity type nitride-based semiconductor layer on the SiN layer at a third substrate temperature, wherein the first substrate temperature is higher than at least one of the second and third substrate temperatures. The first substrate temperature may be higher than both of the second and third substrate temperatures.

The substrate temperature for growing the buffer layer is preferably higher than 900° C. In the step of growing the buffer layer, the V-group element preferably has a partial pressure of lower than 500 Pa. The whole or part of the buffer layer is preferably grown under a pressure of lower than 95 kPa. The whole or part of the first conductivity type nitride-based semiconductor layer is preferably grown under a pressure of lower than 95 kPa. The method of producing a nitride-based semiconductor device may further include the steps of growing a light-emitting layer on the first conductivity nitride-based semiconductor layer and growing a second conductivity type nitride-based semiconductor layer on the light-emitting layer. The whole or part of the light-emitting layer is preferably grown under a pressure of lower than 95 kPa. The whole or part of the second conductivity type nitride-based semiconductor layer is preferably grown under a pressure of lower than 95 kPa. In the step of growing the buffer layer, a reactive gas is made to flow over the substrate preferably at a speed of more than 10 cm/second. The buffer layer is preferably grown to a thickness of greater than 10 nm. The thickness of the SiN layer is preferably set to include three atomic layers or less.

A nitride-based semiconductor light-emitting device improved in light-emitting efficiency can be obtained by including the $In_xAl_yGa_{1-x-y}N$ ($0 \leq x$, $0 \leq y$, $x+y<1$) buffer layer, the SiN layer, the first conductivity type nitride-based semiconductor layer, the light-emitting layer, and the second conductivity type semiconductor layer formed on the semiconductor substrate by the above-described method. In the nitride-based semiconductor light-emitting device, at least one SiN layer may be included in the first conductivity type nitride-based semiconductor layer. On the other hand, the SiN layer may be omitted in the nitride-based semiconductor light-emitting device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
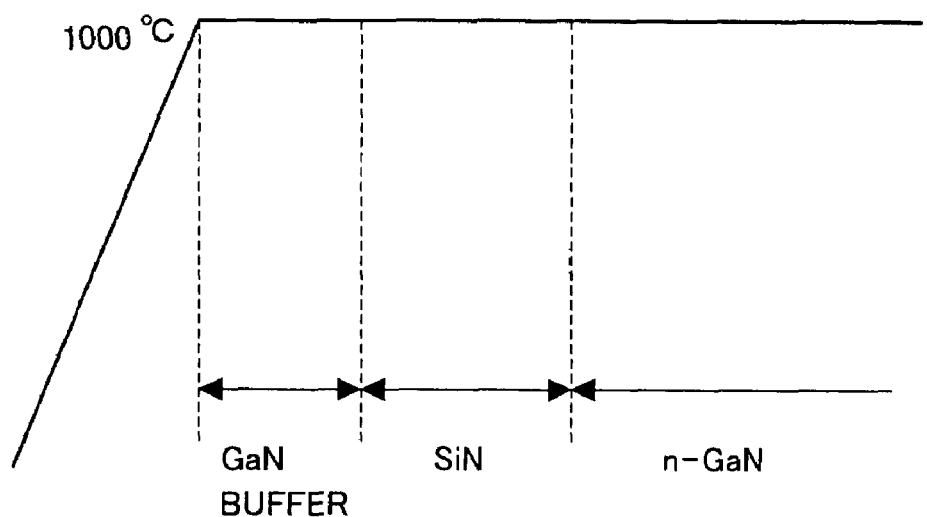
FIG. 1 is a schematic diagram showing a temperature profile during growth of a plurality of compound semiconductor layers in an embodiment of the present invention.
Figure 2:
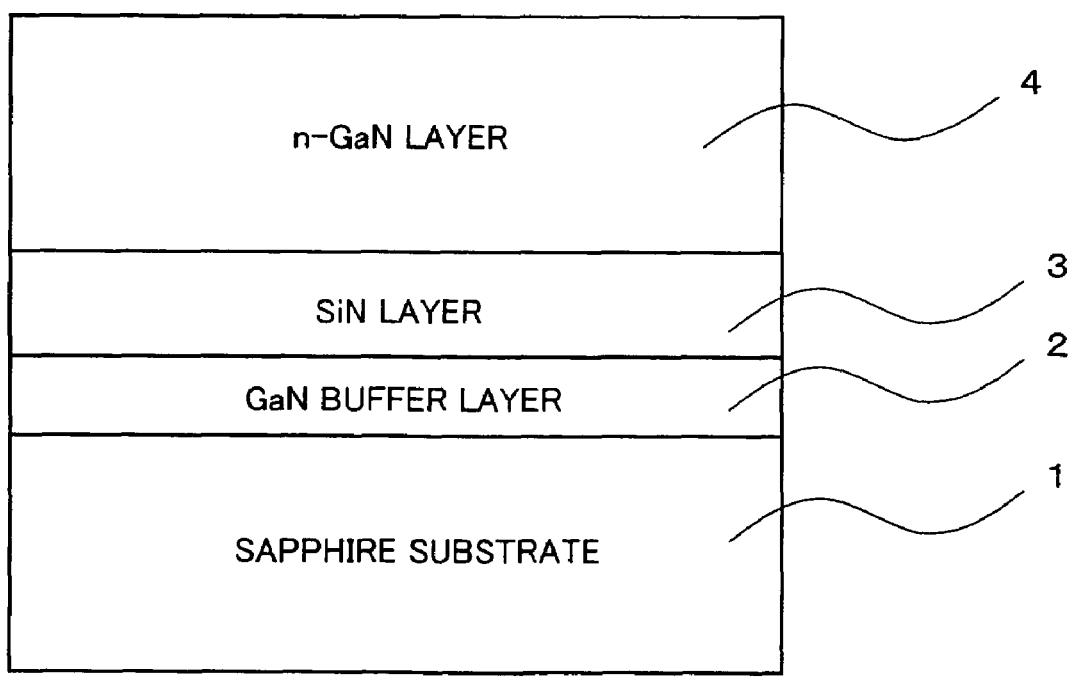
FIG. 2 is a schematic cross sectional view of a nitride-based compound semiconductor device that can be produced using the temperature profile of FIG. 1.

A schematic diagram of FIG. 1 shows a growth temperature profile of nitride-based compound semiconductor layers in a first embodiment of the present invention. Specifically, in the diagram of FIG. 1, the vertical direction represents the temperature, and the horizontal direction represents the growth time of the semiconductor layers. A schematic cross sectional view of FIG. 2 shows a nitride-based compound semiconductor device produced in the first embodiment. Further, a schematic graph of FIG. 3 shows comparison in threading dislocation density between the nitride-based compound semiconductor device produced in the first embodiment and a nitride-based compound semiconductor device produced by a conventional method.

Referring to FIGS. 1 and 2, with a sapphire substrate 1 being maintained at 1000° C., TMG (trimethyl gallium) and $NH_3$ are supplied to grow a GaN buffer layer 2 to about 10 nm thickness. Next, with the substrate temperature held at 1000° C., $SiH_4$ and $NH_3$ are supplied to grow a SiN layer 3 to about 20 nm thickness. Further, with the substrate temperature held at 1000° C., TMG, $NH_3$ and $SiH_4$ are supplied to grow an n type GaN layer 4 to 4 µm thickness. Thereafter, the obtained wafer is cooled to a room temperature.

Figure 3:
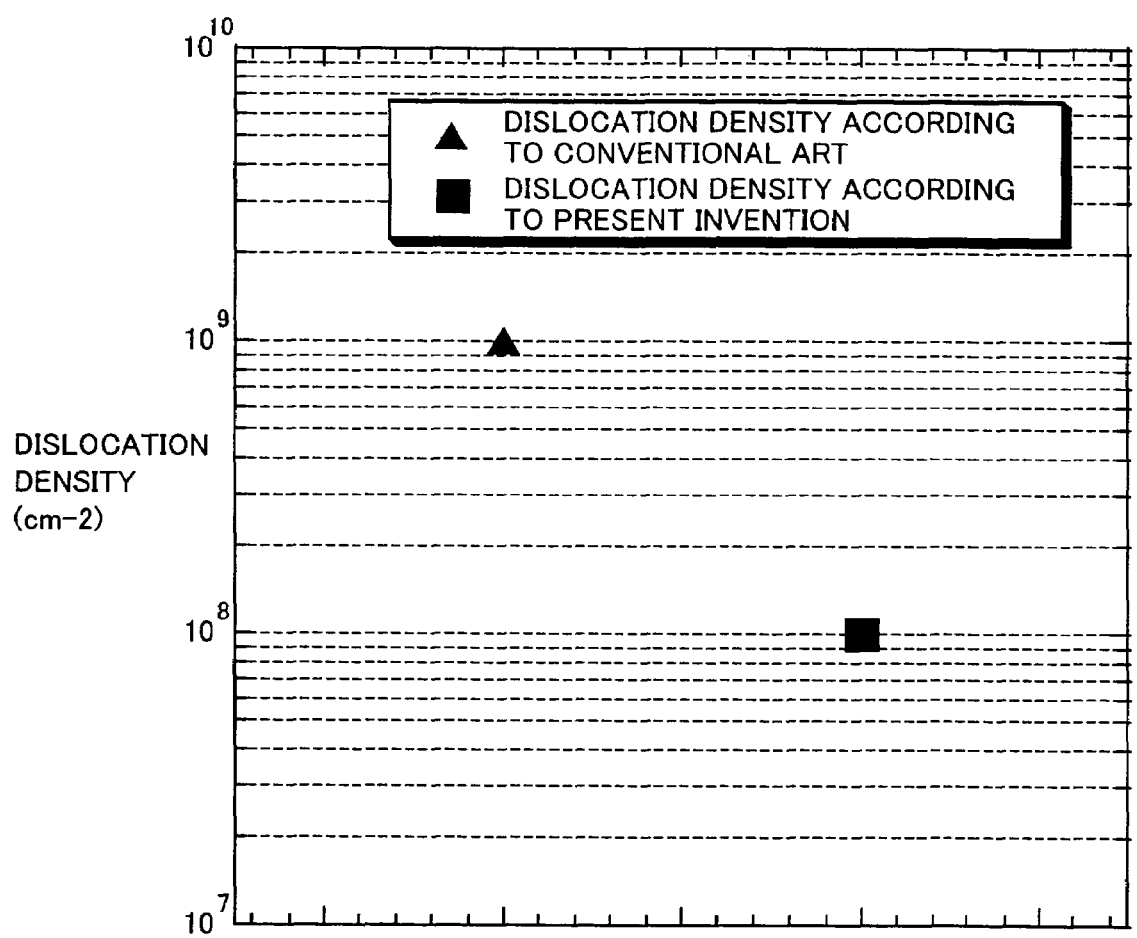
FIG. 3 is a schematic graph illustrating comparison in dislocation density between the nitride-based compound semiconductor device produced using the temperature profile of FIG. 1 and a conventional nitride-based compound semiconductor device.

Dislocation density of the nitride-based compound semiconductor device thus obtained was measured by a cathode luminescence method and it was $1 \times 10^8 / cm^2$ as shown by a black square mark in FIG. 3. By comparison, dislocation density of a nitride-based compound semiconductor device produced by the conventional technique disclosed in Japanese Patent Laying-Open No. 06-196757 was $1 \times 10^9 / cm^2$ as shown by a black triangle mark in FIG. 3. This means that, in the nitride-based compound semiconductor device of the present embodiment, the dislocation density can be decreased by one order of magnitude compared to the conventional case.

Second Embodiment

Figure 4:
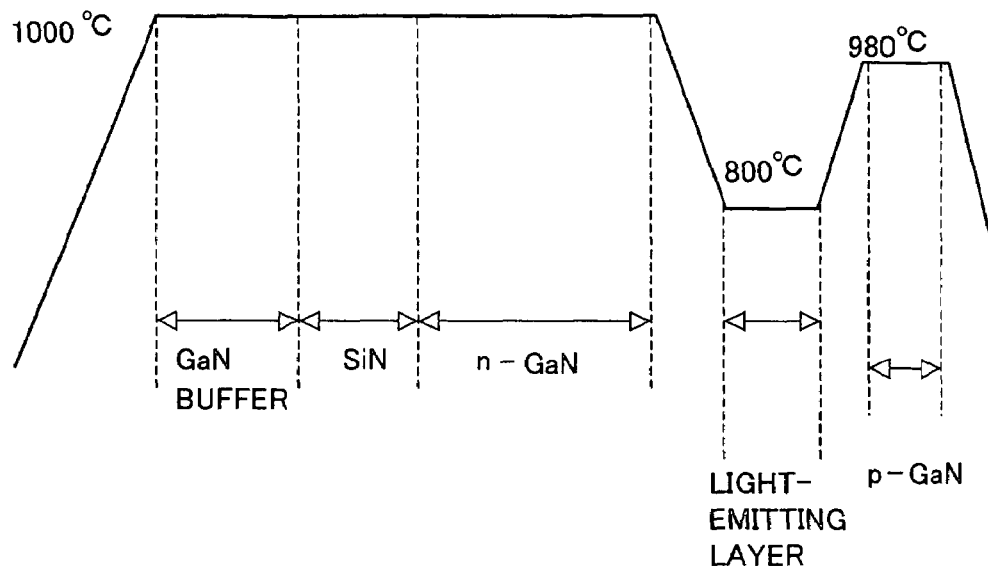
FIG. 4 is a schematic diagram showing a temperature profile during growth of a plurality of compound semiconductor layers in another embodiment of the present invention.
Figure 5:
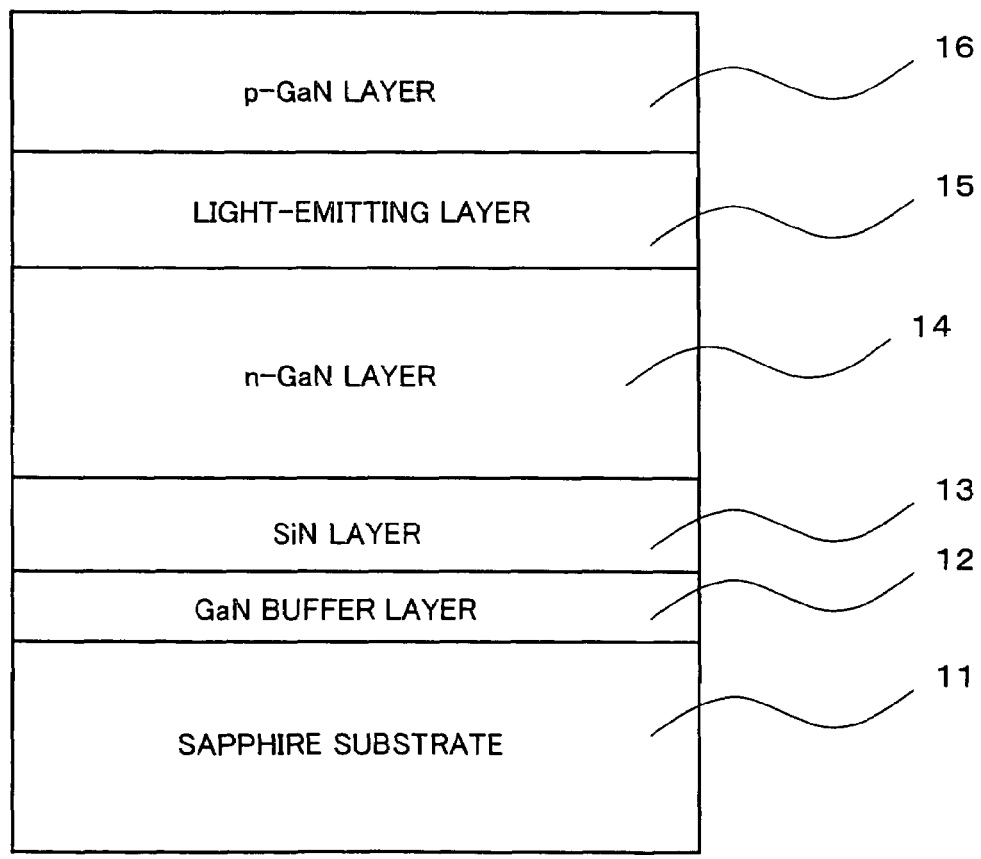
FIG. 5 is a schematic cross sectional view of a nitride-based compound semiconductor light-emitting device that can be produced using the temperature profile of FIG. 4.

A schematic diagram in FIG. 4 shows a growth temperature profile of nitride-based compound semiconductor layers in a second embodiment of the present invention. In the diagram of FIG. 4 as well, the vertical direction represents the temperature, and the horizontal direction represents the growth time of the semiconductor layers. A schematic cross sectional view of FIG. 5 shows a nitride-based compound semiconductor light-emitting device produced in the second embodiment. Layers 11-14 in FIG. 5 correspond to layers 1-4 in FIG. 2, respectively. That is, semiconductor layers 12-14 successively stacked on a substrate 11 in FIG. 5 are formed in a similar manner as semiconductor layers 2-4 successively stacked on substrate 1 in FIG. 2.

After growth of n type GaN layer 14 at the substrate temperature of 1000° C., the substrate temperature is decreased to 800° C. so as to grow a (multiple) quantum well light-emitting layer 15 including InGaN well layer(s) and GaN barrier layer(s). Thereafter, the substrate temperature is increased to 980° C. to grow a p type GaN layer 16.

The nitride-based compound semiconductor light-emitting device thus formed in the second embodiment was measured for its optical output power. As a result, an optical output power of 8 mW was obtained with an injection current of 20 mA. On the other hand, in the case of a light-emitting device different from the second embodiment only in that the layers under the light-emitting layer were formed using the conventional technique disclosed in Japanese Patent Laying-Open No. 06-196757, an optical output power of only 6 mW was obtained with the injection current of 20 mA. This indicates that the nitride-based compound semiconductor light-emitting device of the second embodiment is considerably improved in optical output power compared to the light-emitting device involving the conventional technique.

Third Embodiment

Figure 6:
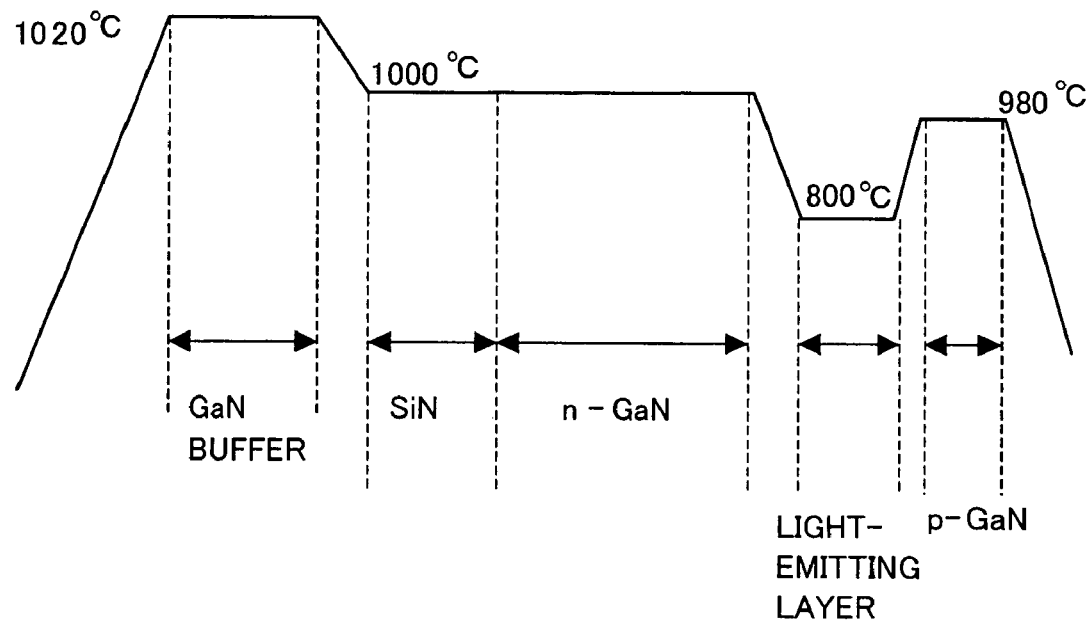
FIG. 6 is a schematic diagram showing a temperature profile during growth of a plurality of compound semiconductor layers in yet another embodiment of the present invention.

A schematic diagram of FIG. 6 shows a growth temperature profile of nitride-based compound semiconductor layers in a third embodiment of the present invention. In the diagram of FIG. 6 as well, the vertical direction represents the temperature, and the horizontal direction represents the growth time of the semiconductor layers. A light-emitting device produced by the third embodiment has a cross sectional structure similar to that shown in FIG. 5.

Referring to FIGS. 5 and 6, with a sapphire substrate 11 being held at 1020° C., TMG and $NH_3$ are supplied to grow a GaN buffer layer 12 to about 10 nm thickness. Next, the substrate temperature is decreased to 1000° C., and a SiN layer 13 is grown to about 20 nm thickness. Thereafter, with the substrate temperature maintained at 1000° C., an n type GaN layer 14 is grown to 4 µm thickness. Next, the substrate temperature is decreased to 800° C. so as to grow a (multiple) quantum well light-emitting layer 15 including InGaN well layer(s) and GaN barrier layer(s). Thereafter, the substrate temperature is increased to 980° C. to grow a p type GaN layer 16.

Optical output power of the nitride-based compound semiconductor light-emitting device thus formed was measured in the third embodiment. As a result, an optical output power of 8 mW was obtained with the injection current of 20 mA, similarly as in the case of the second embodiment. On the other hand, in the case of a light-emitting device different from the third embodiment only in that the conventional technique of Japanese Patent Laying-Open No. 06-196757 was employed to form the layers under the light-emitting layer, an optical output power of only 6 mW was obtained with the injection current of 20 mA. This shows that the nitride-based compound semiconductor light-emitting device of the third embodiment is also considerably improved in optical output power compared to the light-emitting device involving the conventional technique.

Fourth Embodiment

Figure 7:
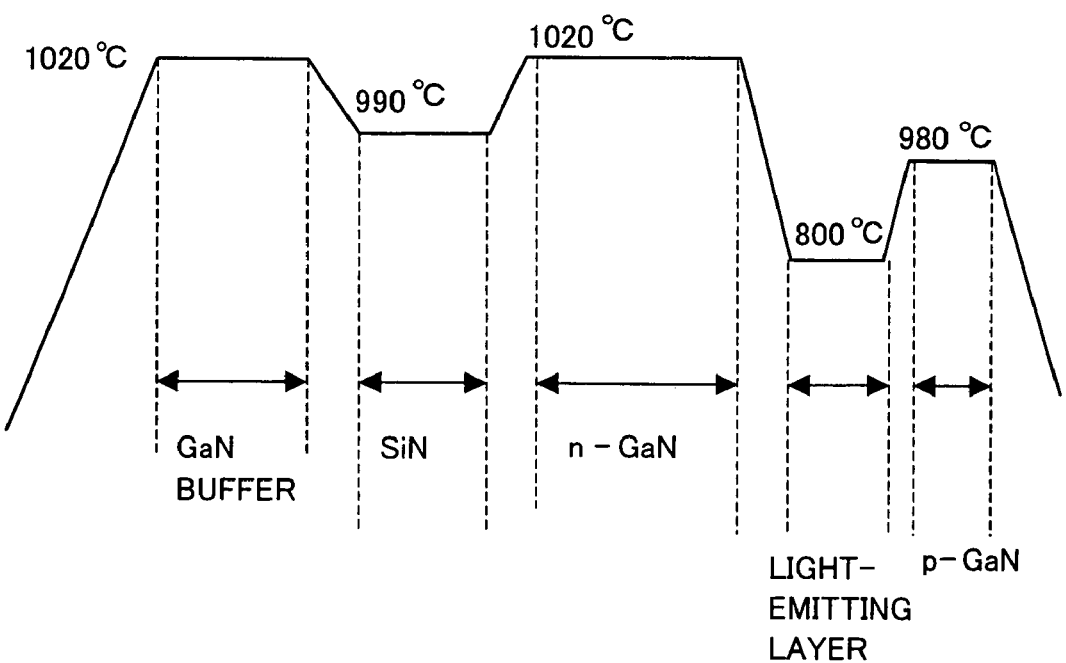
FIG. 7 is a schematic diagram showing a temperature profile during growth of a plurality of compound semiconductor layers in yet another embodiment of the present invention.

A schematic diagram of FIG. 7 shows a growth temperature profile of nitride-based compound semiconductor layers in a fourth embodiment of the present invention. In the diagram of FIG. 7 as well, the vertical direction represents the temperature, and the horizontal direction represents the growth time of the semiconductor layers. A cross sectional structure of a light-emitting device produced in the fourth embodiment is similar to that shown in FIG. 5.

Referring to FIGS. 5 and 7, a sapphire substrate 11 is initially maintained at 1020° C., and a GaN buffer layer 12 is grown to about 10 nm thickness. Next, the substrate temperature is decreased to 990° C., and a SiN layer 13 is grown to about 20 nm thickness. With the substrate temperature increased again to 1020° C., an n type GaN layer 14 is grown to 4 µm thickness. Further, the substrate temperature is decreased to 800° C. so as to grow a (multiple) quantum well light-emitting layer 15 including InGaN well layer(s) and GaN barrier layer(s). Thereafter, the substrate temperature is increased to 980° C. to grow a p type GaN layer 16.

Optical output power of the nitride-based compound semiconductor light-emitting device thus formed was measured in the fourth embodiment. The result was 8.5 mW with the injection current of 20 mA. On the other hand, in the case of a light-emitting device different from the fourth embodiment only in that the layers under the light-emitting layer were formed using the conventional technique of Japanese Patent Laying-Open No. 06-196757, an optical output power of only 6.5 mW was obtained with the injection current of 20 mA. This indicates that the nitride-based compound semiconductor light-emitting device of the fourth embodiment is also considerably improved in optical output power compared to the light-emitting device involving the conventional technique.

Fifth Embodiment

Figure 8:
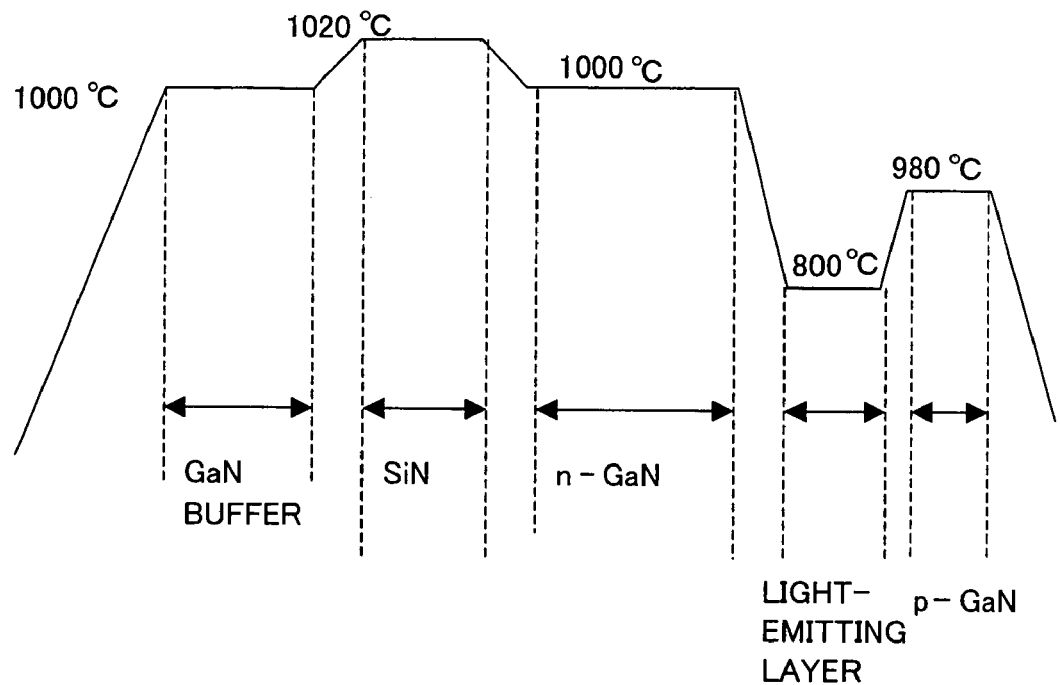
FIG. 8 is a schematic diagram showing a temperature profile during growth of a plurality of compound semiconductor layers in yet another embodiment of the present invention.

A schematic diagram of FIG. 8 shows a growth temperature profile of nitride-based compound semiconductor layers in a fifth embodiment of the present invention. In the diagram of FIG. 8 as well, the vertical direction represents the temperature and the horizontal direction represents the growth time of the semiconductor layers. The light-emitting device of the fifth embodiment also has a cross sectional structure similar to that shown in FIG. 5.

Referring to FIGS. 5 and 8, a sapphire substrate 11 is initially maintained at 1000° C., and a GaN buffer layer 12 is grown to about 10 nm thickness. Next, the substrate temperature is increased to 1020° C., and a SiN layer 13 is grown to about 20 nm thickness. The substrate temperature is decreased again to 1000° C., and an n type GaN layer 14 is grown to 4 µm thickness. Further, with the substrate temperature decreased to 800° C. so as to grow a (multiple) quantum well light-emitting layer 15 including InGaN well layer(s) and GaN barrier layer(s). Thereafter, the substrate temperature is increased to 980° C. to grow a p type GaN layer 16.

Optical output power of the nitride-based compound semiconductor light-emitting device thus formed was measured in the fifth embodiment. The result was 8.5 mW with the injection current of 20 mA. On the other hand, in the case of a light-emitting device different from the fifth embodiment only in that the layers under the light-emitting layer were formed using the conventional technique of Japanese Patent Laying-Open No. 06-196757, an optical output power of only 6.5 mW was obtained with the injection current of 20 mA. This shows that the nitride-based compound semiconductor light-emitting device of the fifth embodiment is also considerably improved in optical output power compared to the light-emitting device involving the conventional technique.

Sixth Embodiment

Figure 9:
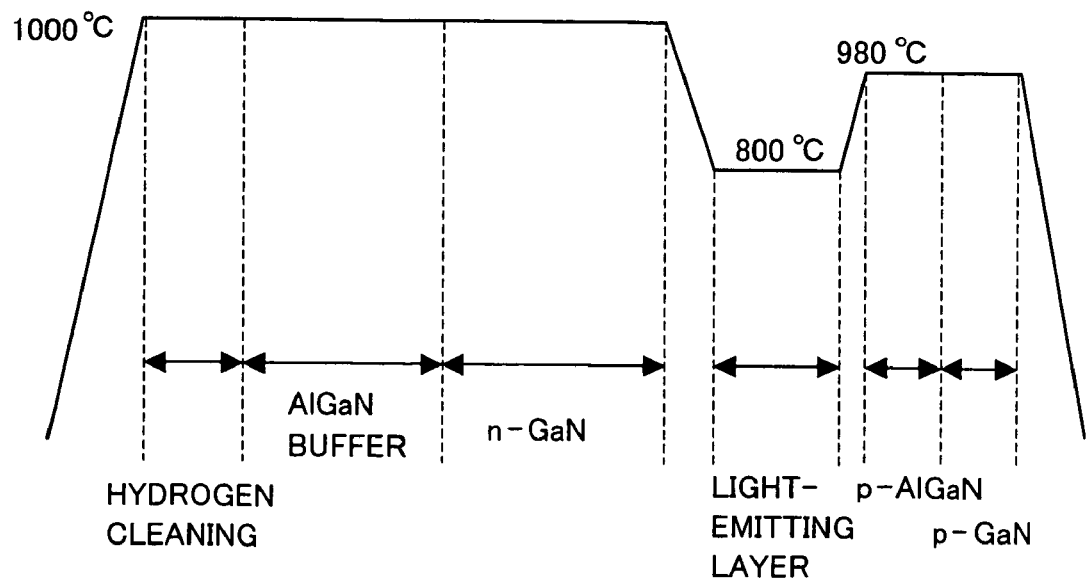
FIG. 9 is a schematic diagram showing a temperature profile during growth of a plurality of compound semiconductor layers in yet another embodiment of the present invention.
Figure 10:
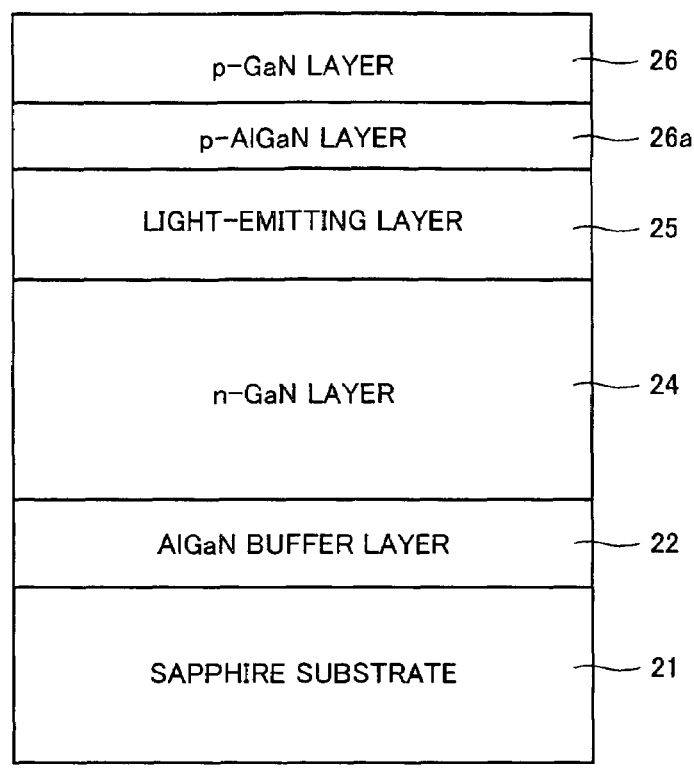
FIG. 10 is a schematic cross sectional view of a nitride-based compound semiconductor light-emitting device that can be produced using the temperature profile of FIG. 9.

A schematic diagram of FIG. 9 shows a growth temperature profile of nitride-based compound semiconductor layers in a sixth embodiment of the present invention. In the diagram of FIG. 9 as well, the vertical direction represents the temperature and the horizontal direction represents the growth time of the semiconductor layers. A schematic cross sectional view of FIG. 10 shows a nitride-based compound semiconductor light-emitting device produced in the sixth embodiment.

Initially, the interior of an MOCVD furnace is controlled to a pressure of 13.3 kPa. Next, a sapphire substrate 21 is heated from a room temperature to 1000° C. under the pressure of 13.3 kPa, and is maintained at 1000° C. for 10 minutes. At this time, hydrogen is fed at a rate of 15 liters per minute. Next, supply of $NH_3$ is started at 100 ccm, and approximately at the same time, supply of TMG and TMA is also started. TMG and TMA are fed at flow rates of 51.3 µmol/minute and 25.5 µmol/minute, respectively, hydrogen is used as a carrier gas, and the total flow rate is set to 30 liters per minute. Under these conditions, an AlGaN buffer layer 22 is grown to about 0.7 µm thickness in 60 minutes.

Next, supply of TMG and TMA into the furnace is stopped. $NH_3$ is fed at 100 ccm, and hydrogen is fed to achieve the total flow rate of 30 liters per minute. In this state, pressure in the furnace is changed from 13.3 kPa to 93.3 kPa. When the pressure is stabilized at 93.3 kPa, the flow rate of $NH_3$ is set to 3.5 liters per minute, TMG is fed at a flow rate of 160 µmol/minute, and $SiH_4$ is supplied at 70 ccm, to grow an n type GaN layer 24 to 4 µm thickness.

Next, the substrate temperature is decreased to 800° C. so as to grow a (multiple) quantum well light-emitting layer 25 including InGaN well layer(s) and GaN barrier layer(s). Thereafter, the substrate temperature is increased to 980° C., and a p type AlGaN layer 16a and a p type GaN layer 16 are grown successively.

Optical output power of the nitride-based compound semiconductor light-emitting device thus produced was measured in the sixth embodiment. The result was 8.5 mW with the injection current of 20 mA. On the other hand, in the case of a light-emitting device different from the sixth embodiment only in that the layers under the light-emitting layer were formed using the conventional technique of Japanese Patent Laying-Open No. 06-196757, an optical output power of only 6.5 mW was obtained with the injection current of 20 mA. This means that the nitride-based compound semiconductor light-emitting device of the sixth embodiment is also considerably improved in optical output power compared to the light-emitting device involving the conventional technique.

Seventh Embodiment

Figure 11:
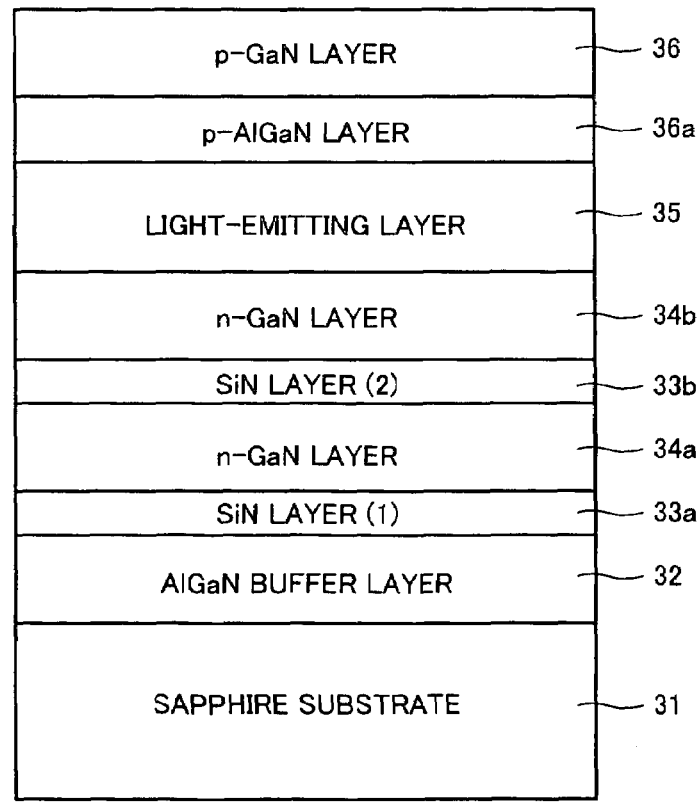
FIG. 11 is a schematic cross sectional view of a nitride-based compound semiconductor light-emitting device that can be produced in yet another embodiment of the present invention.

A schematic cross sectional view of FIG. 11 shows a nitride-based compound semiconductor light-emitting device produced in a seventh embodiment. To produce this light-emitting device, the interior of an MOCVD furnace is controlled to a pressure of 13.3 kPa. A sapphire substrate 31 is heated from a room temperature to 1000° C. under the pressure of 13.3 kPa, and maintained at 1000° C. for 10 minutes, during which hydrogen is fed at 15 liters per minute.

Next, supply of $NH_3$ is started at 100 ccm, and supply of TMG and TMA is also started approximately at the same time. TMG and TMA are fed at flow rates of 51.3 μmol/minute and 25.5 μmol/minute, respectively, hydrogen is used for a carrier gas, and the total flow rate is set to 30 liters per minute. Under these conditions, an AlGaN buffer layer 32 is grown to about 0.7 μm thickness in 60 minutes.

Next, supply of TMG and TMA into the furnace is stopped. $NH_3$ is fed at 100 ccm, and hydrogen is fed to achieve the total flow rate of 30 liters per minute. In this state, $SiH_4$ of 30 ppm is supplied at 5 ccm for three minutes to form a SiN layer (1) 33a.

Next, the pressure in the furnace is changed from 13.3 kPa to 93.3 kPa. When the pressure is stabilized at 93.3 kPa, $NH_3$ is fed at a flow rate of 3.5 liters per minute, TMG is fed at 160 μmol/minute, and $SiH_4$ of 1 ppm is supplied at 70 ccm, to grow an n type GaN layer 34a to 4 μm thickness.

Next, supply of TMG into the furnace is stopped, $NH_3$ is fed at 100 ccm, and hydrogen is fed to achieve the total flow rate of 30 liters per minute. In this state, $SiH_4$ of 30 ppm is supplied at 2 ccm for one minute to form a SiN layer (2) 33b.

Next, $NH_3$ is fed at a flow rate of 3.5 liters per minute, TMG is fed at a flow rate of 160 μmol/minute, and $SiH_4$ of 1 ppm is supplied at 70 ccm to grow an n type GaN layer 34b to 2 μm thickness.

Next, the substrate temperature is decreased to 800° C. to grow a light-emitting layer 35. Thereafter, the substrate temperature is increased to 980° C. to grow a p type AlGaN layer 36a and a p type GaN layer 36 successively.

Although two SiN layers 33a and 33b are provided in the seventh embodiment, a greater number of SiN layers may be provided. Further, the conditions of flow rates and pressures of various gases may be changed as appropriate, not restricted to those specifically described above.

Optical output power of the nitride-based compound semiconductor light-emitting device thus produced was measured in the seventh embodiment. The result was 8.5 mW with the injection current of 20 mA. On the other hand, in the case of a light-emitting device different from the seventh embodiment only in that the layers under the light-emitting layer were formed using the conventional technique of Japanese Patent Laying-Open No. 06-196757, an optical output power of only 6.5 mW was obtained with the injection current of 20 mA. This indicates that the nitride-based compound semiconductor light-emitting device of the seventh embodiment is also considerably improved in optical output power compared to the light-emitting device involving the conventional technique.

Eighth Embodiment

Figure 12:
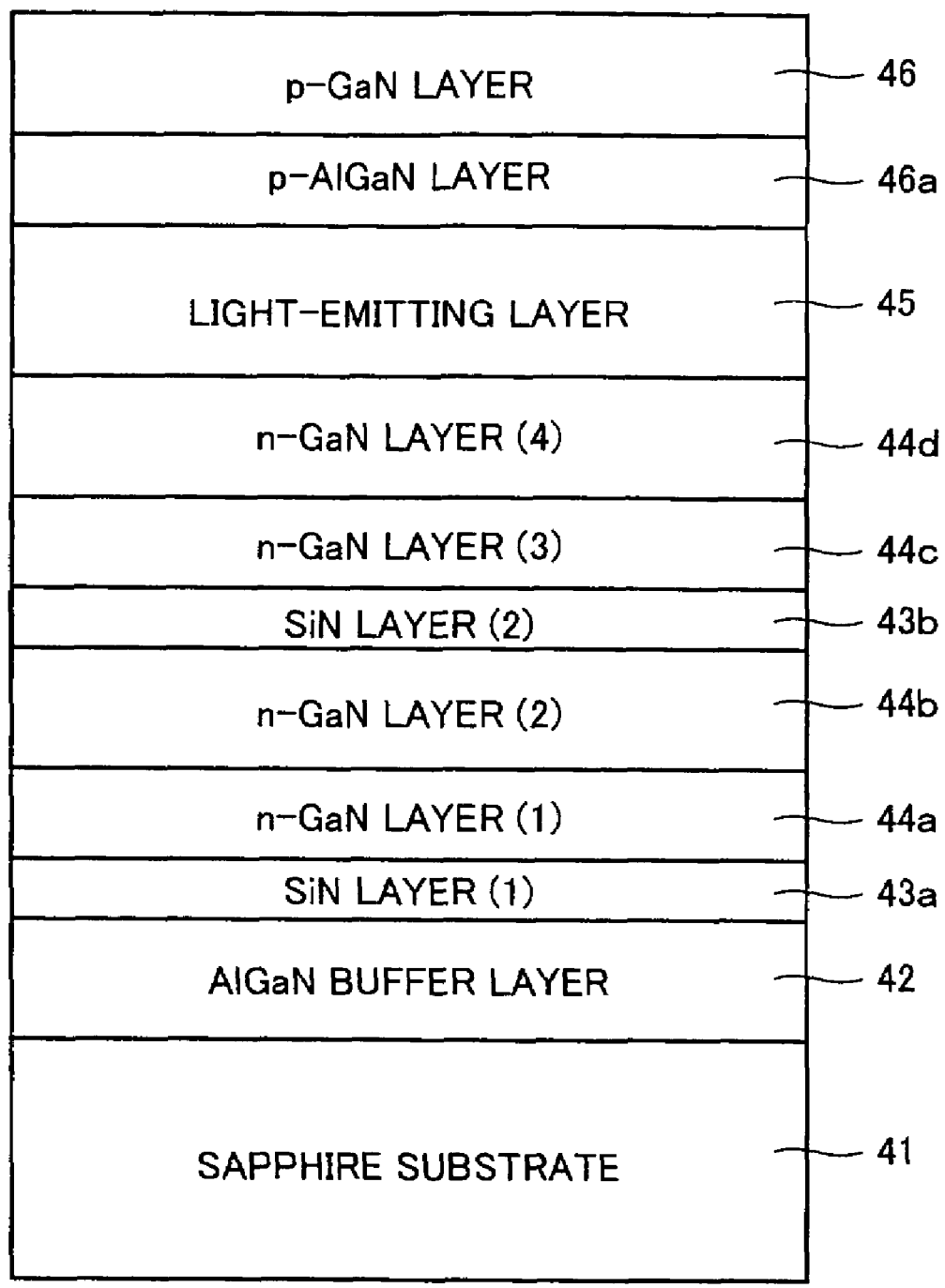
FIG. 12 is a schematic cross sectional view of a nitride-based compound semiconductor light-emitting device that can be produced in yet another embodiment of the present invention.

A schematic cross sectional view of FIG. 12 shows a nitride-based compound semiconductor light-emitting device produced in an eighth embodiment. To produce this light-emitting device, the interior of an MOCVD furnace is initially controlled to a pressure of 13.3 kPa. Under the pressure of 13.3 kPa, a sapphire substrate 41 is heated from a room temperature to 1000° C., and maintained at 1000° C. for 10 minutes. At this time, hydrogen is fed at 15 liters per minute.

Next, supply of $NH_3$ is started at 100 ccm, and supply of TMG and TMA is also started approximately at the same time. TMG is fed at a flow rate of 51.3 μmol/minute, and TMA is fed at a flow rate of 25.5 μmol/minute, hydrogen is used for a carrier gas, and the total flow rate is set to 30 liters per minute. Under these conditions, an AlGaN buffer layer 42 is grown to about 0.7 μm thickness in 60 minutes.

Next, with the supply of TMG and TMA into the furnace being stopped, $NH_3$ is fed at 100 ccm, and hydrogen is fed to achieve the total flow rate of 30 liters per minute. In this state, $SiH_4$ of 30 ppm is supplied at 5 ccm for three minutes to form a SiN layer (1) 43a.

Next, the flow rate of $NH_3$ is changed to 3.5 liters per minute, TMG is fed at 160 μmol/minute, and $SiH_4$ of 1 ppm is supplied at 70 ccm, to thereby grow an n type GaN layer (1) 44a to 1 μm thickness.

Next, the pressure in the furnace is changed from 13.3 kPa to 93.3 kPa. When the pressure is stabilized at 93.3 kPa, $NH_3$ is fed at a flow rate of 3.5 liters per minute, TMG is fed at a flow rate of 160 μmol/minute, and $SiH_4$ of 1 ppm is supplied at 70 ccm, to grow an n type GaN layer (2) 44b to 3 μm thickness.

Next, the pressure in the furnace is changed from 93.3 kPa to 13.3 kPa. When the pressure is stabilized at 13.3 kPa, $NH_3$ is fed at 100 ccm, and hydrogen is fed to achieve the total flow rate of 30 liters per minute. In this state, $SiH_4$ of 30 ppm is supplied at 5 ccm for two minutes to form a SiN layer (2) 43b.

Next, $NH_3$ is fed again at a flow rate of 3.5 liters per minute, TMG is fed at a flow rate of 160 μmol/minute, and $SiH_4$ of 1 ppm is supplied at 70 ccm, to grow an n type GaN layer (3) 44c to 1 μm thickness.

Next, the pressure in the furnace is changed from 13.3 kPa to 93.3 kPa. When the pressure is stabilized at 93.3 kPa, $NH_3$ is fed at a flow rate of 3.5 liters per minute, TMG is fed at a flow rate of 160 μmol/minute, and $SiH_4$ of 1 ppm is supplied at 70 ccm, to grow an n type GaN layer (4) 44d to 3 μm thickness.

Next, the substrate temperature is decreased to 800° C. to grow a light-emitting layer is grown. Thereafter, the substrate temperature is increased to 980° C. to grow a p type AlGaN layer 46a and a p type GaN layer 46 successively.

Although some and the other of the plurality of n type GaN layers have been grown under the pressures of 93.3 kPa and 13.3 kPa respectively in the eighth embodiment, the pressure values are not restricted thereto. All of the plurality of n type GaN layers may be grown under the same pressure.

Optical output power of the nitride-based compound semiconductor light-emitting device produced in the above-described manner was measured in the eighth embodiment. The result was 8.5 mW with the injection current of 20 mA. On the other hand, in the case of a light-emitting device different from the eighth embodiment only in that the layers under the light-emitting layer were formed using the conventional technique of Japanese Patent Laying-Open No. 06-196757, an optical output power of only 6.5 mW was obtained with the injection current of 20 mA. This shows that the nitride-based compound semiconductor light-emitting device of the eighth embodiment is also considerably improved in optical output power compared to the light-emitting device involving the conventional technique.

Although various embodiments have been described above, the growth temperature of the buffer layer only needs to be higher than 900° C. This can reduce dislocations generated at the interface with the sapphire substrate. In other words, the dislocation density will increase more and more as the growth temperature of the buffer layer decreases from 900° C.

Further, the V-group element is preferably set to have a partial pressure of 500 Pa or lower. This can restrict gas phase reaction of the V-group element with the III-group element, and accordingly, the crystal quality of the semiconductor layer as well as in-plane uniformity is improved. In other words, the gas phase reaction will occur at the partial pressure more than 500 Pa of the V-group element, leading to degradation of in-plane uniformity.

Further, the flow speed of the reactive gas fed over the substrate is preferably greater than 10 cm/second. This can improve the in-plane uniformity of the growing semiconductor layer. The in-plane uniformity will be degraded more and more as the flow speed is lowered therefrom.

The buffer layer preferably has a thickness of greater than 10 nm. In doing so, the threading dislocation density can be decreased. In other words, the threading dislocation density will increase with the thinner buffer layer. More preferably, the buffer layer has a thickness of 100 nm or greater. When the buffer layer is made to have a thickness of more than 100 nm, the density of the dislocations threading upwards from the buffer layer can further be decreased.

Preferably, the thickness of the SiN layer is set to include three atomic layers or less. If the SiN layer is thicker than three atomic layers, the SiN layer having a low dislocation density and a good crystal quality may be obtained, but it will take time to grow the thick SiN layer. Even a very thin SiN layer is effective, so that it is preferable to restrict its thickness to about three atomic layers in order to reduce the growth time and increase the productivity. The SiN layer may even be omitted if so required from the standpoint of the productivity.

Furthermore, it is preferable to grow the whole or part of the first conductivity type nitride-based semiconductor layer (the n type layer in the above-described embodiments) under a pressure of lower than 95 kPa. This can promote the growth of the n type layer in the lateral direction, leading to improvement of in-plane uniformity thereof. When the whole or part of the light-emitting layer is grown under a pressure of less than 95 kPa, its in-plane uniformity increases. Further, when the whole or part of the second conductivity type nitride-based semiconductor layer (the p type layer in the above-described embodiments) is grown under a pressure of lower than 95 kPa, its in-plane uniformity increases.

As described above, in the present invention, the crystal quality of the buffer layer can be improved by growing the buffer layer on the substrate at the substrate temperature higher than that at the time of growing the SiN layer or the first conductivity type nitride-based semiconductor layer. Further, it is possible to reduce generation of the dislocations by growing the SiN layer on the buffer layer at the substrate temperature lower than that at the time of growing the buffer layer. Still further, it is possible to obtain a nitride-based semiconductor device of a high quality with generation of the threading dislocations being suppressed by growing the first conductivity type nitride-based semiconductor layer on the SiN layer at a substrate temperature lower than that at the time of growing the buffer layer. By growing a light-emitting layer and a second conductivity type semiconductor layer on this nitride-based semiconductor device, it is possible to produce a light-emitting diode or a laser diode improved in light-emitting efficiency. Incidentally, the SiN layer may be omitted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing a nitride-based semiconductor device, comprising the steps of:
    growing an $In_xAl_yGa_{1-x-y}N$ ($0 \leq x$, $0 \leq y$, $x+y<1$) buffer layer on a substrate at a first substrate temperature;
    growing a SiN layer on said buffer layer at a second substrate temperature;
    growing a first conductivity type nitride-based semiconductor layer on said SiN layer at a third substrate temperature; and
    growing a light-emitting layer on said first conductivity type nitride-based semiconductor layer at a fourth substrate temperature;
    said first substrate temperature being higher than at least one of said second and third substrate temperatures and said fourth substrate temperature being lower than the second substrate temperature and the third substrate temperature.

2. The method of producing a nitride-based semiconductor device according to claim 1, wherein said first substrate temperature is higher than both of said second and third substrate temperatures.

3. The method of producing a nitride-based semiconductor device according to claim 1, wherein the thickness of said SiN layer is set to include three atomic layers or less.

4. The method of producing a nitride-based semiconductor device according to claim 1, further comprising the step of:
    growing a second conductivity type nitride-based semiconductor layer on said light-emitting layer.

* * * * *